(12) United States Patent
Motokawa

(10) Patent No.: US 11,508,934 B2
(45) Date of Patent: Nov. 22, 2022

(54) DISPLAY DEVICE

(71) Applicant: Japan Display Inc., Tokyo (JP)

(72) Inventor: Kyuri Motokawa, Tokyo (JP)

(73) Assignee: JAPAN DISPLAY INC., Tokyo (JP)

(*) Notice: Subject to any disclaimer, the term of this patent is extended or adjusted under 35 U.S.C. 154(b) by 110 days.

(21) Appl. No.: 17/030,398

(22) Filed: Sep. 24, 2020

(65) Prior Publication Data

US 2021/0098738 A1 Apr. 1, 2021

(30) Foreign Application Priority Data

Sep. 30, 2019 (JP) .............................. JP2019-179788

(51) Int. Cl.
*H01L 51/52* (2006.01)
*H01L 27/32* (2006.01)

(52) U.S. Cl.
CPC ...... *H01L 51/5246* (2013.01); *H01L 27/3258* (2013.01); *H01L 51/5253* (2013.01)

(58) Field of Classification Search
CPC ............. H01L 27/3258; H01L 51/5253; H01L 51/5246
See application file for complete search history.

(56) References Cited

U.S. PATENT DOCUMENTS

2017/0069873 A1* 3/2017 Kim ..................... H01L 51/525
2017/0345881 A1* 11/2017 Kim ................... H01L 51/5271
2018/0159077 A1* 6/2018 Lee ..................... H01L 51/5253
2021/0175464 A1* 6/2021 Wang .................. H01L 51/5246
2021/0359252 A1* 11/2021 Wang .................. H01L 51/5253

FOREIGN PATENT DOCUMENTS

JP 2012-022889 A 2/2012

* cited by examiner

*Primary Examiner* — Vongsavanh Sengdara
(74) *Attorney, Agent, or Firm* — Xsensus LLP

(57) ABSTRACT

A display device includes, a display region, and a peripheral region arranged outside of the display region, the peripheral region includes, a first inorganic insulating layer, a first organic insulating layer arranged on the first inorganic insulating layer, and a second inorganic insulating layer arranged on the first organic insulating layer, wherein a part of the first inorganic insulating layer in the display region side from a slope of the first inorganic insulating layer is in contact with the second inorganic insulating layer, the slope of the first inorganic insulating layer is exposed at the end part of the periphery region, and includes a bottomed hole with a concave and convex part, and the density of a fluorine ions in the concave and convex part is more than 100 times greater than the density of the fluorine ions in the first inorganic insulating layer arranged in the display region.

7 Claims, 15 Drawing Sheets

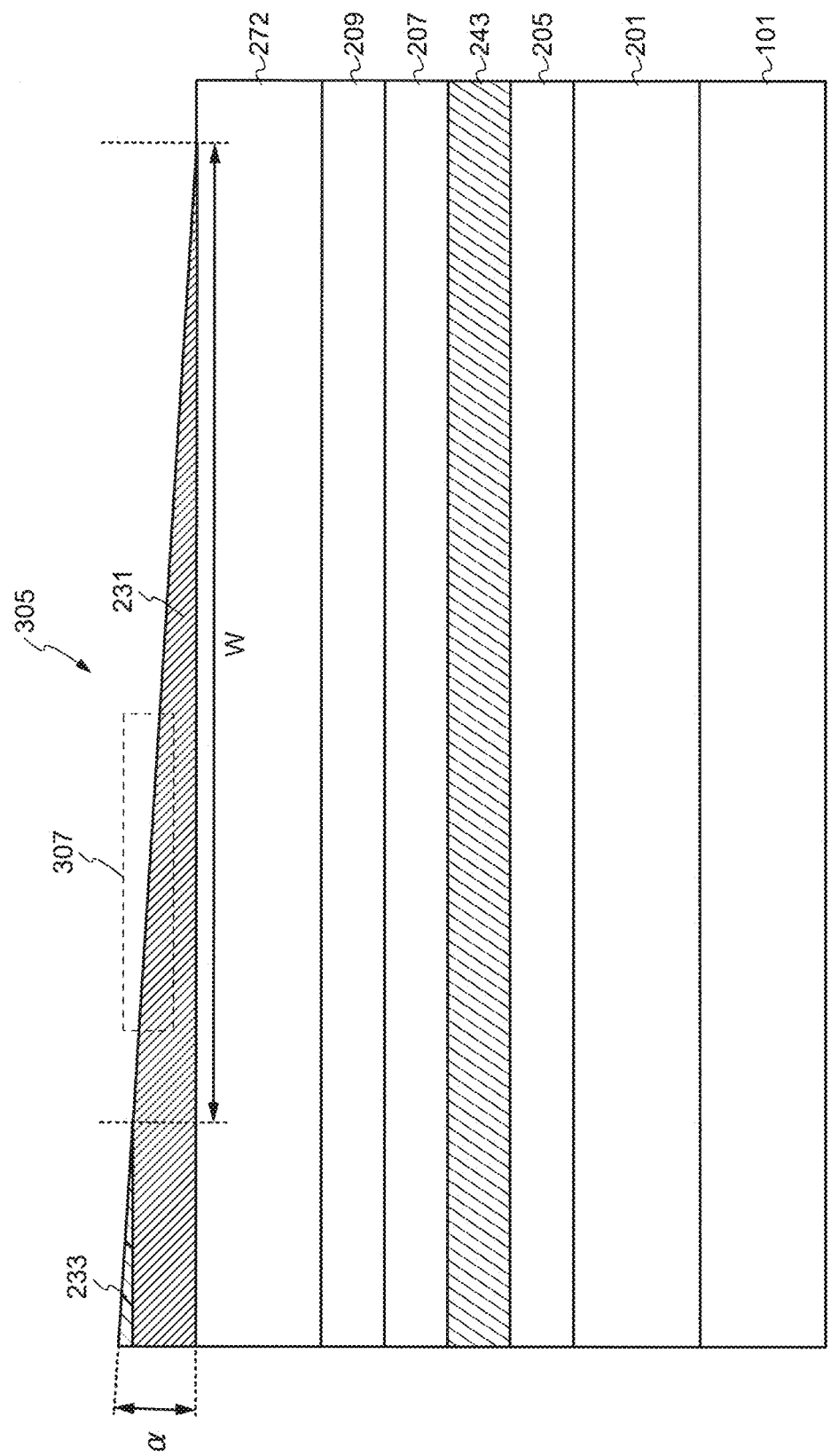

DISPLAY DEVICE

CROSS-REFERENCE TO RELATED APPLICATIONS

This application is based upon and claims the benefit of priority from the prior Japanese Patent Application No. 2019-179788, filed on Sep. 30, 2019, the entire contents of which are incorporated herein by reference.

FIELD

An embodiment of the present invention relates to a display device and a manufacturing method for display device.

BACKGROUND

Conventionally, an organic EL display device in which an organic electroluminescent material (organic EL material) is used as a light emitting element (organic EL element) of a display region has been known as a display device. The organic EL display device displays images on the display region by emitting the light of the organic electroluminescent material. The organic EL display device is called a self-light emitting type display device.

The light emitting element included in the display region, for example, deteriorates due to moisture. In the organic EL display device, for example, by arranging a sealing film on the light emitting element can prevent moisture from entering the light emitting element. At the time of inspection when manufacturing the organic EL display device, by inspecting the location where the sealing film is arranged to the display region, it is possible to detect a manufacturing defect in which moisture penetrates into the light emitting element at an early stage. For example, in the organic EL display device, an organic insulating layer, and an inorganic insulating layer are formed to cover the light emitting element. In this structure, a moisture-barrier region is arranged at the inorganic insulating layer to block moisture.

SUMMARY

A display device according to an embodiment of the present invention includes a display region and a peripheral region arranged outside of a display region, and the peripheral region includes an interlayer insulating film, a first inorganic insulating layer arranged on an interlayer insulating film, a first organic insulating layer arranged on a first inorganic insulating layer, a second inorganic insulating layer arranged on a first organic insulating layer, and a second organic insulating layer arranged on a second inorganic insulating layer, wherein a part of the first inorganic insulating layer on a region side of the first inorganic insulating layer relative to a slope of the first inorganic insulating layer is in contact with the second inorganic insulating layer, slope of the first inorganic insulating layer includes an uneven part including a bottomed hole that is exposed at an end part of the peripheral region, and density of fluorine ions included in the uneven part is more than 100 times density of fluorine ions included in the first inorganic insulating layer arranged on the display region.

BRIEF DESCRIPTION OF DRAWINGS

FIG. 7 is an enlarged view showing a part of an end part of substrate included in a peripheral region of a display device according to an embodiment of the present invention;

DESCRIPTION OF EMBODIMENTS

Figure 1:
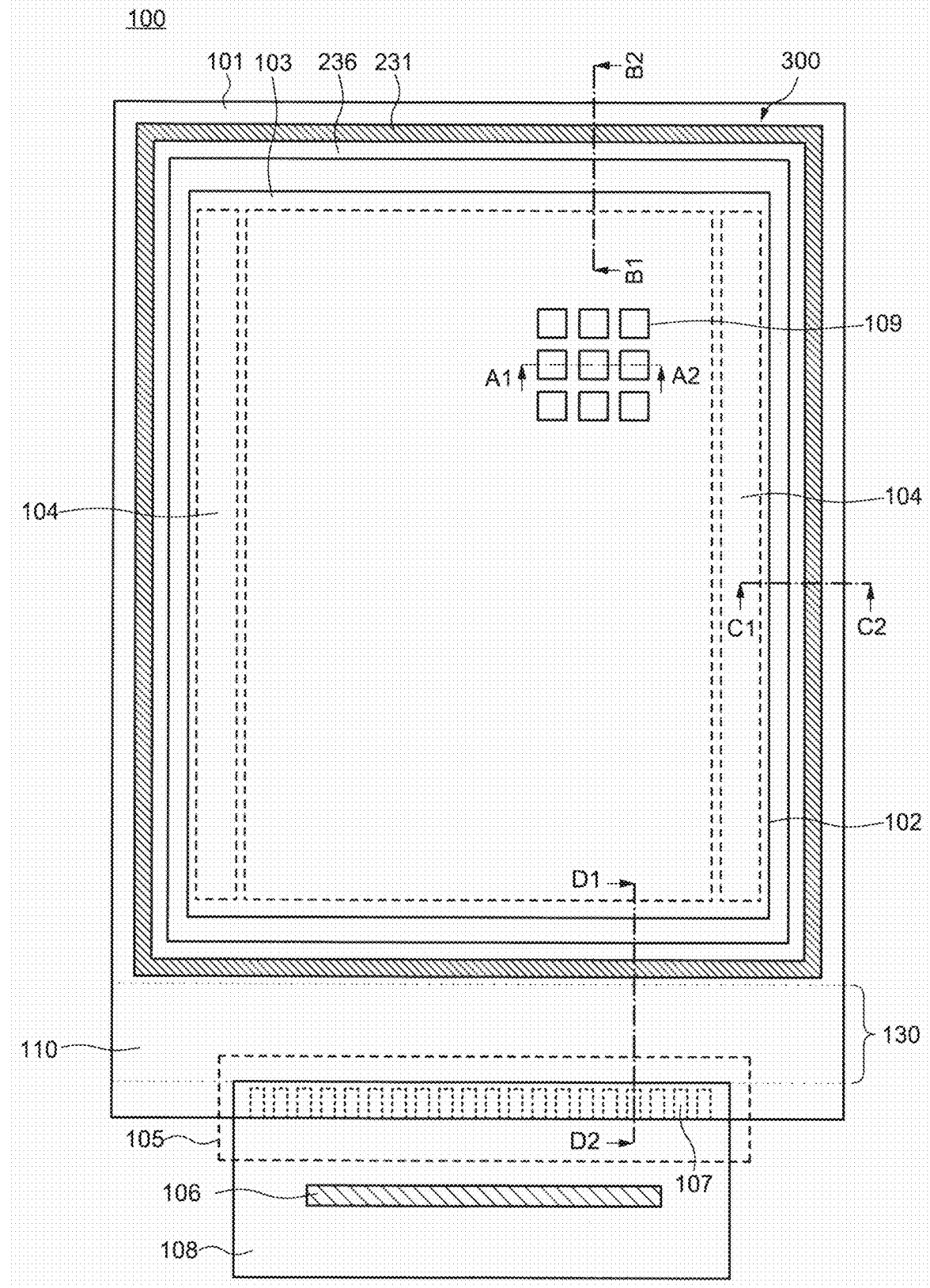
FIG. 1 is a schematic view showing the configuration of a display device according to an embodiment of the present invention.

Hereinafter, each embodiment of the present invention is explained below while referring to the drawings. However, the present invention can be implemented in various modes without departing from the gist of the technical idea thereof, and is not construed as being limited to the description of the embodiments exemplified below.

The drawings may be schematically represented in terms of width, thickness, shape, and the like of each part as compared with the actual embodiments for clarity of description, but are merely examples, and the illustrated shape itself is not limited to the interpretation of the present invention. In addition, in the drawings, elements having the same functions as those described with reference to the drawings already described in the specification are denoted by the same reference numerals even in other drawings, and overlapping descriptions are omitted in some cases.

When a film is processed to form a plurality of structures, each structure may have a different function and role, and each structure may have a different base on which it is formed. However, these plurality of structures are derived from a film formed as the same layer in the same process, and have the same material. Therefore, the plurality of films is defined as existing in the same layer.

In expressing a mode of arranging another structure on a certain structure, the case of simply expressing "on" includes both the case of arranging another structure directly on a certain structure in contact with the structure and the case of arranging another structure on the certain structure through another structure, unless otherwise specified.

The phrase "a first structure is exposed from a second structure" means a region in which a part of a structure is not covered by the second structure. However, a case where an exposed part of the first structure is covered by a third structure is also included.

The organic EL display device mentioned above, the materials for forming a sealing film, an organic insulating layer, and an inorganic insulating layer are often colorless and transparent. Therefore, it is difficult to inspect the location of where the sealing film, the organic insulating layer, and the inorganic insulating layer are arranged at the display region while manufacturing the organic EL display device. Therefore, even if the sealing film, the organic insulating layer, and the inorganic insulating layer block moisture, it is difficult to detect a manufacturing defect in which moisture penetrates into the light emitting element at an early stage.

In view of the above-mentioned problems, it is an object of the present invention to provide a display device for easily inspecting the location on where the sealing film, the organic insulating layer, and the inorganic insulating layer are arranged at the display region.

First Embodiment

Referring to FIG. 1 to 9, a display device 100 according to an embodiment of the present invention will be described.

[1. Display Device]

FIG. 1 is a plan view of the display device 100 according to an embodiment of the present invention. The display device 100 has a display region 103 and a peripheral region 110. The peripheral region 110 is arranged on the outside of the display region 103. The display region 103 and the peripheral region 110 are arranged on a substrate 101.

The display region 103 is a region for displaying images or videos on the display device 100. The display region 103 includes a plurality of pixels 109. As shown in FIG. 1, the plurality of pixels 109 are arranged in a matrix. The arrangement of the plurality of pixels 109 is not limited to the structure shown in FIG. 1. The array of the plurality of pixels 109 may be, for example, a staggered array.

The peripheral region 110 includes a substrate peripheral part 300, a scanning line drive circuit part 104, a terminal part 105, and a folded part 130. As shown in FIG. 1, the substrate peripheral part 300 includes, for example, a second organic insulating layer 236 (refer FIG. 6), a first inorganic insulating layer 231 (refer FIG. 6), and a second inorganic insulating layer 233 (omitted in FIG. 1, refer FIG. 6).

As will be described in detail later, the first inorganic insulating layer 231 is arranged at both the display region 103 and the peripheral region 110. The first inorganic insulating layer 231 arranged in display region 103 does not include a concave and convex part 301 (refer FIG. 8A), and the first inorganic insulating layer 231 arranged in the peripheral region 110 includes the concave and convex part 301 (refer FIG. 8A). As a result, in the top view of the display device 100, a substrate peripheral part 300 appears as a black line. Since, the substrate peripheral part 300 appears in the black line, it is possible to identify the sealed location during the manufacturing inspection of the display device 100. That is, by specifying the sealed location during manufacturing inspection of the display device 100 according to the embodiment of the present invention, it is possible to detect a manufacturing defect in which moisture penetrates into the light emitting element at an early stage. The substrate peripheral part 300 will be described in detail later.

As shown in FIG. 1, the scanning line drive circuit part 104 is, for example, arranged along a long side of the display region 103. The location of the scanning line drive circuit part 104 is not limited to the location shown in FIG. 1. The scanning line drive circuit part 104 may be arranged along a short side of the display region 103. Further, as shown in FIG. 1, the scanning line drive circuit part 104 is arranged at two locations sandwiching the display region 103. The location where the scanning line drive circuit part 104 is arranged is not limited to the location shown in FIG. 1. The scanning line drive circuit part 104 may be arranged in one location. The terminal part 105 is arranged on an end part of the substrate 101. The terminal part 105 includes a plurality of terminals 107. The plurality of terminals 107 are connected to a flexible printed circuit substrate 108. A driver IC 106 is arranged on the flexible printed circuit substrate 108. A folded part 130 is a region which is capable of folding the substrate 101. The folded part 130 is arranged between the display region 103 and the terminal part 105. In the display device 100, back surface of the terminal part 105 and the display region 103 may be superimposed by folding the substrate 101 at the folded part 130. By superimposing back surface of the terminal part 105 and the display region 103, it is possible to narrow the frame of the display device 100.

A video signal and various control signals are supplied from an external controller (not shown) of the display device 100 to the display device 100 via the flexible printed circuit substrate 108. The video signal is signal-processed in the driver IC 106 and input to a plurality of pixels 109. The various circuit signals are input to the scanning line drive circuit part 104 via the driver IC 106.

The power for driving the scanning line drive circuit part 104, the driver IC 106, and the plurality of pixels 109 is provided from the external controller (not shown) of the display device 100 via the flexible printed circuit substrate 108 to the display device 100. Each of the plurality of pixels 109 includes alight emitting element 240, which will be described later. A part of the power provided to the display device 100 is provided to the light emitting element 240. As a result, the light emitting element 240 emits the light.

Further, in the display device 100, a polarization plate 102 is arranged superimposed on the display region 103 and the scanning line drive circuit part 104. The structure of the display device 100 is not limited to the structure shown in FIG. 1. The display device 100 may not have the polarization plate 102. The structure of the display device 100 is appropriately determined within a range not departing from the gist of the embodiment.

[2. Pixel Circuit]

Figure 2:
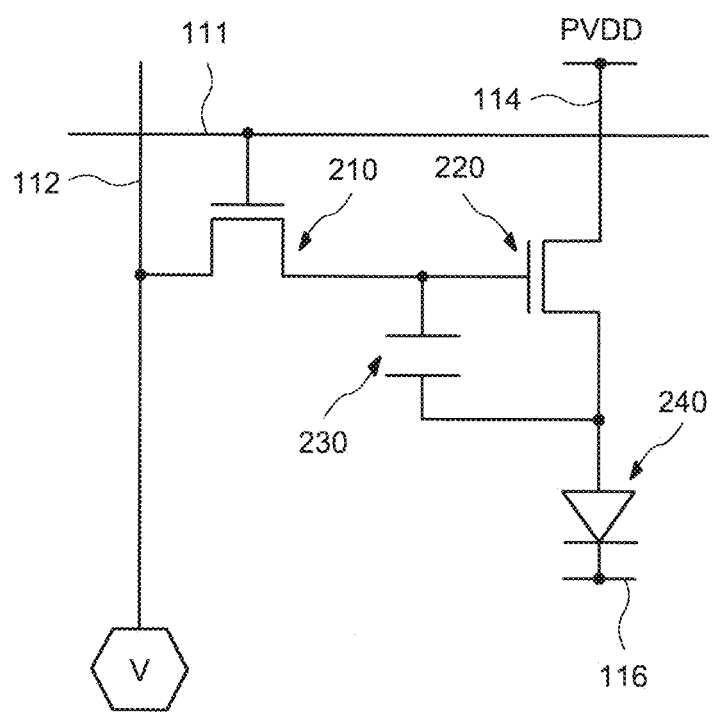
FIG. 2 is a pixel circuit diagram of a display device according to an embodiment of the present invention.

FIG. 2 shows a pixel circuit which each of the plurality of pixels 109 has according to an embodiment of the present invention. Description of the same or similar components as those in FIG. 1 may be omitted.

As shown in FIG. 2, the pixel circuit includes at least a transistor 210, a transistor 220, a capacitor 230, and the light emitting element 240.

The transistor 210, for example, functions as a selecting transistor. The conduction status of a gate of the transistor 210 is controlled by a scanning line 111. In the transistor 210, the gates, sources, and drains are electrically connected to the gates of the scanning line 111, a signal line 112, and the transistor 220, respectively.

The transistor 220 functions as a drive transistor. The transistor 220 controls a light emission luminance of the light emitting element 240. In the transistor 220, the gates, sources, and drains are electrically connected to the sources of the transistor 210, a driving power supply line 114, and the anode of the light emitting element 240, respectively.

In the capacitor 230, one of electrodes of the capacitor 230 is electrically connected to the gate of the transistor 220 and to the drain of the transistor 210. The other of electrodes of the capacitor 230 is also connected to the anode of the light emitting element 240 and to the drain of the transistor 220.

In the light emitting element 240, the anode is connected to the drain of the transistor 220 and a cathode is connected to a reference power supply line 116.

[3. Display Area]

The configuration of the display region 103 of the display device 100 will be described with reference to FIG. 3. Description of the same or similar components as those of FIG. 1 or FIG. 2 may be omitted.

Figure 3:
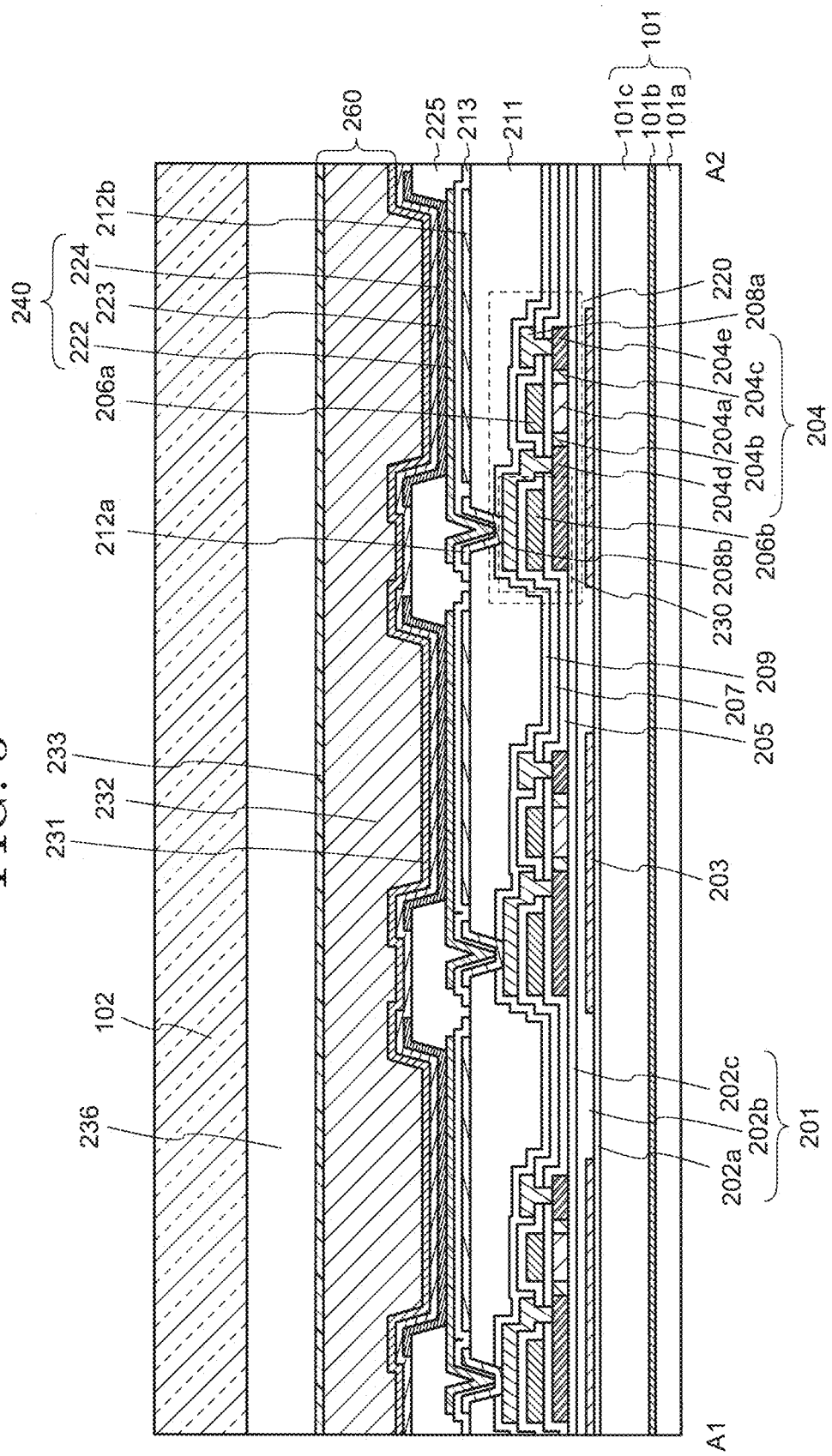
FIG. 3 is a cross-sectional view of a pixel of a display device according to an embodiment of the present invention.

FIG. 3 is a cross-sectional view of a pixel 109 according to an embodiment of the present invention. Specifically, FIG. 3 is a cross-sectional view obtained by cutting the display device 100 shown in FIG. 1 from a line A1 to A2.

The substrate 101 may have a flexibility. As shown in FIG. 3, the substrate 101 is a stacked structure including a first resin layer 101a, an inorganic layer 101b, and a second resin layer 101c. In order to improve the adhesion between the first resin layer 101a and the second resin layer 101c, the inorganic layer 101b is preferably arranged between the first resin layer 101a and the second resin layer 101c. The material forming the first resin layer 101a and the second resin layer 101c may be, for example, an acrylic, a polyimide, a polyethylene terephthalate, or a polyethylene naphthalate. For example, a silicon nitride, a silicon oxide, an amorphous silicon, or the like may be used as a material for forming the inorganic layer 101b. When the substrate 101 does not require the flexibility, for example, glasses can be used as the substrate 101.

An undercoat layer 202 is arranged on the substrate 101. For example, a silicon oxide layer or a silicon nitride layer may be used as a material for forming the undercoat layer 202. In an embodiment of the present invention, the undercoat layer 202 has a three-layer stacked structure of a silicon oxide layer 202a, a silicon nitride layer 202b, and a silicon oxide layer 202c. The silicon oxide layer 202a improves the adhesion to the substrate 101. The silicon nitride layer 202b functions as a blocking film for moisture and impurities from the outside. The silicon oxide layer 202c functions as a blocking film for preventing a hydrogen contained in the silicon nitride layer 202b from diffusing into a semiconductor layer, which will be described later.

The structure of the undercoat layer 202 may be a structure having a light shielding layer 203 in a position overlapping with the transistor 220. Since the undercoat layer 202 has the light shielding layer 203, the light shielding layer 203 blocks an external light. As a result, it is possible to prevent the penetration of the external light into the transistor 220, to suppress the variation of the transistor characteristics. The light shielding layer 203 may be used as a conductive layer. By using the conductive layer in the light shielding layer 203, it is possible to apply a predetermined voltage to the light shielding layer. By applying the predetermined voltage to the light shielding layer 203, it is possible to control the properties of the transistor 220.

The transistor 220 is arranged on the undercoat layer 202. The transistor 220 includes a semiconductor layer 204, a gate insulating layer 205, and a gate electrode 206a. In the example of the pixel circuit shown in FIG. 1, the transistor 220 uses an nch transistor. The transistor 220 can also use a pch transistor. In an embodiment of the present invention, the nch transistor has a low-concentration impurity region 204b and 204c between a channel region 204a and a source region 204d or a drain region 204e (high-concentration impurity region). For example, an oxide semiconductor such as an amorphous silicon, a polysilicon, or an IGZO (Indium Gallium Tin Oxide) may be used as the material for forming the semiconductor layer 204. For example, a silicon oxide or a silicon nitride may be used as the material for forming the gate insulating layer 205. The gate insulating layer 205 can also be a single layer or a stacked layer. For example, a MoW (Molybdenum Tungsten) may be used as the material for forming the gate electrode 206a. In FIG. 3, although the structure of the transistor 220 is shown, the structure of the transistor 210 is also the same as the structure of the transistor 220.

A first interlayer insulating layer 207 is arranged over the gate electrode 206a. For example, a silicon oxide or a silicon nitride may be used as the material for forming the first interlayer insulating layer 207. The first interlayer insulating layer 207 may be a single layer or a stacked layer. A source electrode 208a or a drain electrode 208b are arranged on the first interlayer insulating layer 207. The source electrode 208a or the source electrode 208b is connected to a source region 204d or a drain region 204e of the semiconductor layer 204 via the first interlayer insulating layer 207 and an opening of the gate insulating layer 205.

A conductive layer 206b is arranged on the gate insulating layer 205. The conductive layer 206b is formed in the same process as the gate electrode 206a. The conductive layer 206b constructs a capacitor by the source region 204d or the drain region 204e of the semiconductor layer 204 with the gate insulating layer 205 interposed therebetween. The conductive layer 206b constructs a capacitor by the source electrode 208a or the drain electrode 208b with the first interlayer insulating layer 207 interposed therebetween.

A second interlayer insulating layer 209 is arranged on the source-electrode 208a or the drain electrode 208b.

A planarization film 211 is arranged on the second interlayer insulating layer 209. For example, an organic material such as a photosensitive acrylic or a polyimide may be used as the material for forming planarization film 211. By arranging the planarization film 211, it is possible to flatten the step formed by the transistor 220.

A transparent conductive film 212a and a transparent conductive film 212b are arranged on the planarization film 211. The transparent conductive film 212a is electrically connected to the source electrode 208a or the drain electrode 208b via an opening arranged in the planarization film 211 and the second interlayer insulating layer 209.

An insulating layer 213 is arranged on the transparent conductive film 212a and the transparent conductive film 212b. The insulating layer 213 is arranged with an opening between a region overlapping the transparent conductive film 212a and the source electrode 208a or the drain electrode 208b, and a region between the transparent conductive film 212a and the transparent conductive film 212b of the neighboring pixel.

A pixel electrode 222 is arranged on the insulating layer 213. The pixel electrode 222 is electrically connected to the transparent conductive film 212a via the opening of the insulating layer 213. In an embodiment of the present invention, the pixel electrode 222 is formed as reflective electrode. The pixel electrode 222 has, for example, a stacked structure composed of three layers of IZO (Indium Zinc Oxide), Ag, and IZO.

An insulating layer 225 is arranged at the border between the pixel electrode 222 at any location and the pixel electrode 222 of the neighboring pixel. The insulating layer 225 is arranged for separating the respective pixel. The insulating layer 225 is also called a bank or a rib. An organic material similar to the material of the planarization film 211 may be used as the material for forming insulating layer 225. The insulating layer 225 is opened to expose a part of the pixel electrode 222. The side surface of the opening is preferable to be a gentle tapered shape. If the side surface of the opening is sharp, poor coverage occurs in the organic layer 223 to be formed later.

The planarization film 211 and the insulating layer 225 are in contact with the opening arranged in the insulating layer 213. With this configuration, moisture and gas desorbed from the planarization film 211, the display device 100 can remove from the insulating layer 225 via the opening of the insulating layer 213 during the heat treatment when forming insulating layer 225. Thus, the peeling is suppressed at the interface between the planarization film 211 and the insulating layer 225.

After the insulating layer 225 is formed, form the organic layer 223 for forming an organic EL layer. The Organic layer 223 has at least a hole transport layer, an emitting layer, and an electron transport layer. Starting from the pixel electrode 222 side, the hole transport layer, the emitting layer, and the electron transport layer are stacked. The hole transport layer, the emitting layer, or the electron transport layer may include an organic material. In FIG. 3, it is explained as the organic layer 223 is selectively arranged for the pixel 109, but the structure of the organic layer 223 is not limited to the structure shown in FIG. 3. For example, the emitting layer of the organic layer 223 may be selectively arranged for respective pixels. For example, the hole transport layer and the electron transport layer may be arranged to cover all pixels. Further, a method of forming these layers may be a method of forming by vapor deposition, and a method of forming a coating using solvent dispersion may be used. In addition, not only the hole transport layer and the electron transport layer but also the emitting layer may be arranged to cover all the pixels. If the emitting layer is arranged to cover all the pixels, the emitting layer emits white light. As a result, a desired color wavelength part is able to pick up using a color filter (not shown).

After the organic layer 223 is formed, a counter electrode 224 is formed. In an embodiment of the present invention, the counter electrode 224 needs to be optically transparent because the organic EL layer is a top emission construction. In an embodiment of the present invention, the top emission structure is a structure that emits light from the counter electrode 224 located on the pixel electrode 222 with the organic layer 223 interposed therebetween. In an embodiment of the present invention, an MgAg thin film sufficient to transmit the light from the organic EL layer is formed as the counter electrode 224. According to the order of forming the organic layer 223 described above, the pixel electrode 222 becomes the anode, the counter electrode 224 becomes the cathode.

A sealing film 260 is arranged on the counter electrode 224 of the light emitting element 240. The structure of the sealing film 260 has a structure in which the first inorganic insulating layer 231, an organic insulation layer 232, and a second inorganic insulating layer 233 are stacked.

For example, a silicon oxide, an aluminum oxide, a silicon nitride, an aluminum nitride, a silicon oxynitride, an aluminum oxynitride, or the like may be used as the materials for forming the first inorganic insulating layer 231 and the second inorganic insulating layer 233. The thickness of the first inorganic insulating layer 231 is, for example, more than 750 nm and less than 2000 nm. The thickness of the second inorganic insulating layer 233 is, for example, more than 750 nm and less than 1250 nm. The structures of the first inorganic insulating layer 231 and the second inorganic insulating layer 233 may be stacked structure. The sealing film 260 is one of the functions of preventing moisture from entering the organic layer 223 from the outside. The material forming the sealing film 260 is preferably a material having a high gas barrier property. For example, the first inorganic insulating layer 231 and the second inorganic insulating layer 233 preferably include nitrides such as a silicon nitride or an aluminum nitride. The nitride shall include a nitride containing oxygen.

For example, an acrylic resin, an epoxy resin, a polyimide resin, a silicone resin, a fluoro resin, a siloxane resin or the like may be used as the materials forming the organic insulation layer 232. The thickness of the organic insulation layer 232 is, for example, more than 5 μm and less than 15 μm.

A second organic insulating layer 236 is arranged on the sealing film 260. The second organic insulating layer 236 functions as, for example, masks for etching the first inorganic insulating layer 231 and the second inorganic insulating layer 233. For example, adhesive materials such as an acrylic resin, a rubber-based resin, a silicone-based resin, or a urethane-based resin may be used as the materials for forming the second organic insulating layer 236. The thickness of the second organic insulating layer 236 is, for example, more than 5 μm and less than 25 μm.

A polarization plate 102 is arranged on the second organic insulating layer 236. The polarization plate 102 has a stacked structure including a quarter wave plate and a straight polarization plate. As a result, the display device 100 can emit light from the light emitting region to the outside from the surface of a display side of the polarization plate 102.

The display device 100 may arrange a cover glass on the polarization plate 102, if necessary. In this case, a filling material using a resin or the like may be arranged between the polarization plate 102 and the cover glass. By arranging a filling material between the polarization plate 102 and the cover glass, the vacant space between the polarization plate 102 and the cover glass can be filled. The cover glass may be arranged with a touch sensor or the like.

[4. Peripheral Area]

With reference to FIG. 4 to 8B, the configuration of the peripheral region 110 of the display device 100 will be described. Description of the same or similar components as those of FIG. 1 to 3 may be omitted.

Figure 4:
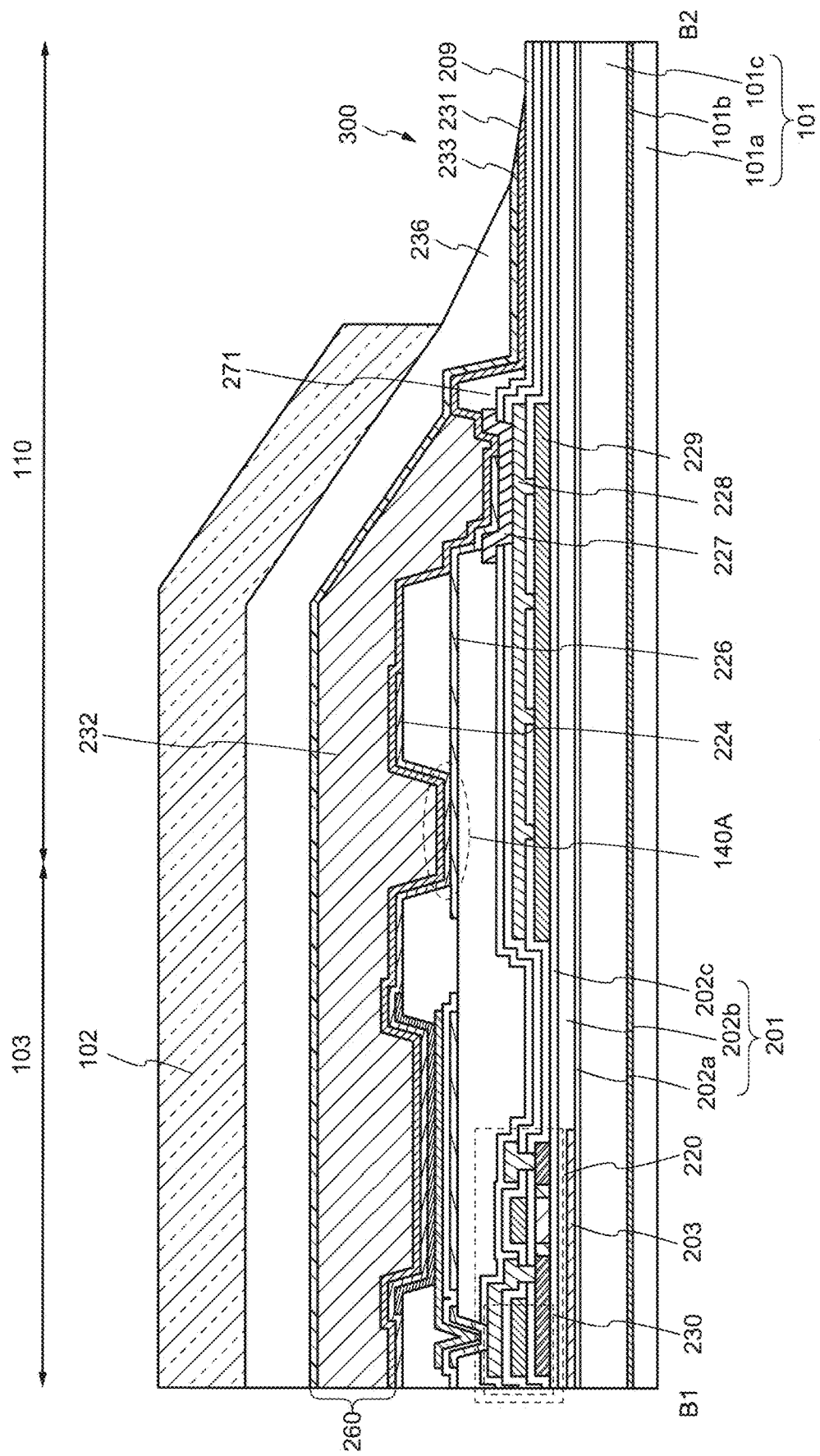
FIG. 4 is a cross-sectional view of a line from B1 to B2 of a display device according to an embodiment of the present invention.

FIG. 4 is a cross-sectional view obtained by cutting the display device 100 shown in FIG. 1 from a line B1 to B2. As shown in FIG. 4, the top of the peripheral region 110 is a region which the various wirings are routed. In the peripheral region 110, the counter electrode 224 of the light emitting element 240 is arranged with a cathode contact 140 which is connected to a transparent conductive film 226. The transparent conductive film 226 is electrically connected to a conductive layer 227, a conductive layer 228, and a wiring layer 229. That is, the counter electrode 224 is electrically connected to one of the plurality of terminals 107 by the wiring layer 229 (FIG. 1).

In end part of the substrate 101, the second organic insulating layer 236, the second inorganic insulating layer 233, and the first inorganic insulating layer 231 are arranged to be inclined outward from the center of the substrate 101.

A part of slope of the second organic insulating layer 236, a part of slope of the second inorganic insulating layer 233, and a part of slope of the first inorganic insulating layer 231 are exposed.

The first inorganic insulating layer 231 is covered with the organic insulation layer 232 from the center of the substrate 101 to a barrier 271, and is in contact with and covered with the second inorganic insulating layer 233 in the upper part of the barrier 271. The first inorganic insulating layer 231 is in contact with and covered with the second inorganic insulating layer 233 from the upper part of the barrier 271 toward the outside of the substrate 101. A part of slope of the first inorganic insulating layer 231 is exposed without being covered by the second inorganic insulating layer 233.

The second inorganic insulating layer 233 is in contact with and covered with the second organic insulating layer 236 from the center of the substrate 101 to the outside of the substrate 101. A part of slope of the second inorganic insulating layer 233 is exposed without being covered by the second organic insulating layer 236.

The second organic insulating layer 236 is in contact with and covered with the polarization plate 102 from the center of the substrate 101 to the outside of the substrate 101. A part of slope of the second organic insulating layer 236 is exposed without being by the polarization plate 102.

Figure 5:
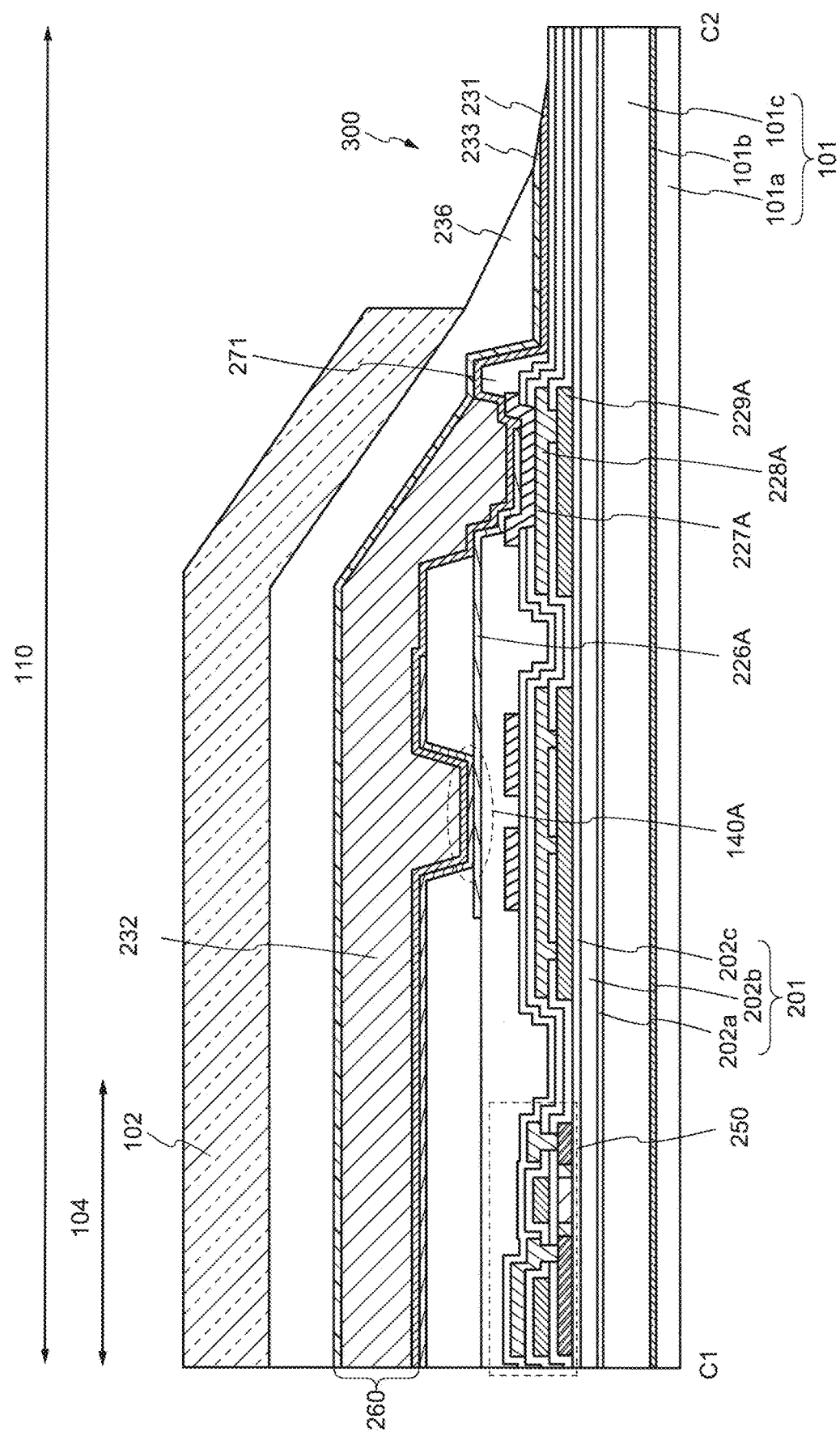
FIG. 5 is a cross-sectional view of a line from C1 to C2 of a display device according to an embodiment of the present invention.

FIG. 5 is a cross-sectional view obtained by cutting the display device 100 shown in FIG. 1 from a line C1 to C2. Description of the same or similar components as those of FIG. 1 to 4 may be omitted. As shown in FIG. 5, the peripheral region 110 of the substrate 101 is a region in which the scanning line drive circuit part 104 is arranged. The scanning line drive circuit part 104 includes a transistor 250. The transistor 250 may have the same structure as the transistors 210 and 220 arranged in the pixel 109, or may have a different structure. Further, in the scanning line drive circuit part 104, it is not necessary to arrange the light shielding layer 203.

In a region between the scanning line drive circuit part 104 and end part of the substrate 101, a cathode contact 140A is arranged to which the counter electrode 224 and a transparent conductive film 226A are connected. The transparent conductive film 226A is electrically connected to a conductive layer 227A, a conductive layer 228A, and a wiring layer 229A. That is, the counter electrode 224 is electrically connected to one of the plurality of terminals 107 by the wiring layer 229A.

Figure 6:
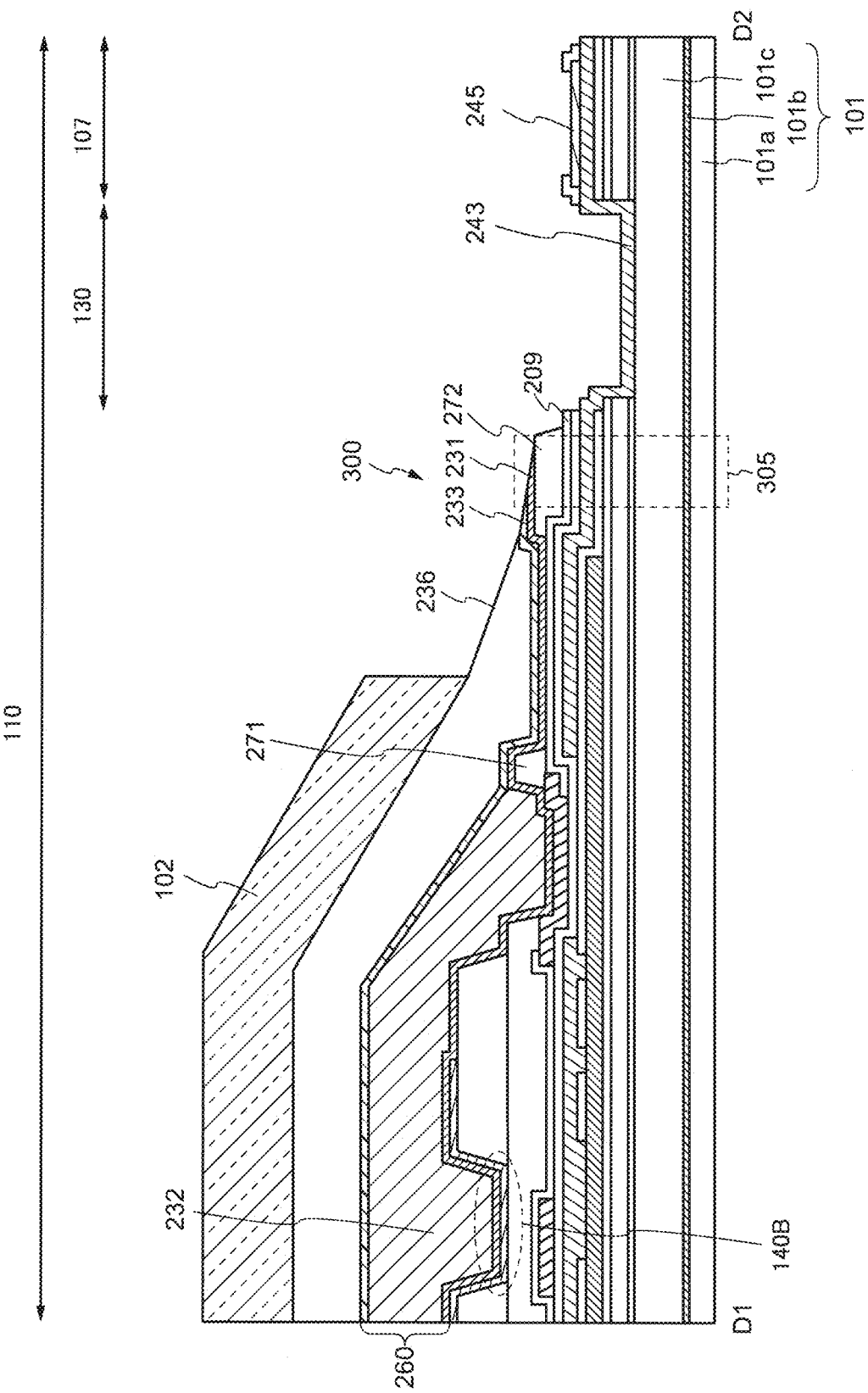
FIG. 6 is a cross-sectional view of a line from D1 to D2 of a display device according to an embodiment of the present invention.

In the peripheral region 110 of the substrate 101 shown in FIG. 5, the construction of the substrate peripheral part 300 is similar to the construction described in FIG. 4 to 6, and thus the description herein is omitted.

FIG. 6 is a cross-sectional view obtained by cutting the display device 100 shown in FIG. 1 from a line D1 to D2. The peripheral region 110 of the substrate 101 shown in FIG. 6 includes the folded part 130 and the plurality of terminals 107.

The counter electrode 224 of the light emitting element 240 is arranged with a cathode contact 140B which is connected to the transparent conductive film 226. The wiring layer 243 is a routing wiring. The wiring layer 243 extends in the peripheral region 110 and is exposed near end part of the substrate 101. A region in contact with the wiring layer 243 and the transparent conductive film 245 becomes a terminal 107.

As the substrate 101 is folded, particularly, an inorganic insulating layer or the like has poor toughness, and therefore makes it crack easily. In the display device 100 according to the embodiment, since the inorganic insulating layer of the folded part 130 is removed, crack will not occur when the substrate 101 is bent. In order to secure the strength of the region, a resin layer or the like may be further arranged on the wiring layer 244 to cover the folded part 130.

The structure of the substrate peripheral part 300 near the folded part 130 of the substrate 101 is shown in FIG. 6 is also similar to the structure described in FIGS. 4 and 5. In FIG. 6, the structures similar to those described in FIGS. 4 and 5 are omitted. In FIG. 6, a barrier 272 arranged between the first inorganic insulating layer 231 and the second interlayer insulating layer 209 of the substrate peripheral part 300 may not be necessary. As in FIGS. 4 and 5, the first inorganic insulating layer 231 overlaps and contacts the second interlayer insulating layer 209.

FIG. 7 is an enlarged view of a part of the substrate peripheral part 305 shown in FIG. 6. As shown in FIG. 7, in the substrate peripheral part 300, the width of a region where the first inorganic insulating layer 231 is exposed is indicated by the width W. The angle between a slope where the first inorganic insulating layer 231 is exposed and the surface of the barrier 272 where the first inorganic insulating layer 231 is in contact is indicated by the angle α. In an embodiment of the present invention, the width W of the region where the first inorganic insulating layer 231 is exposed is preferably a value in the range of more than 3.7 μm and less than 5.6 μm, and the angle α is preferably a value in the range of more than 20 degrees and less than 26 degrees.

Figure 8A:
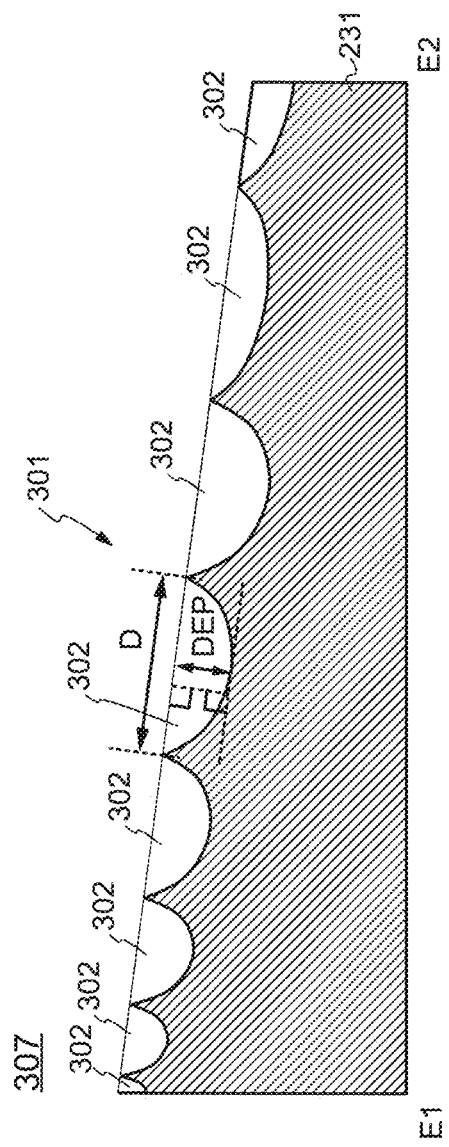
FIG. 8A is an enlarged view showing a part of an end part of substrate included in a peripheral region of a display device according to an embodiment of the present invention.
Figure 8B:
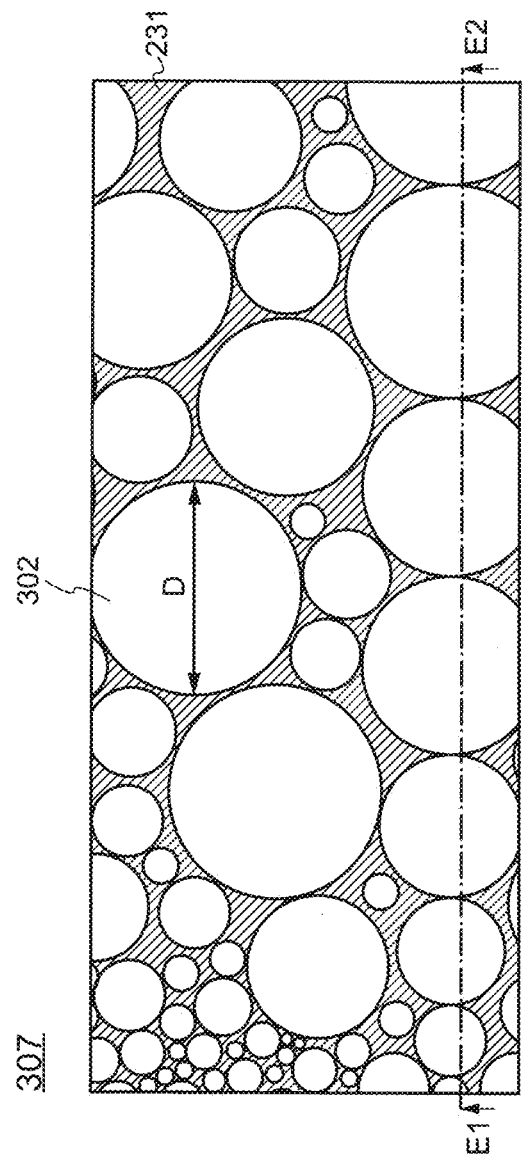
FIG. 8B is an enlarged view showing a part of an end part of substrate included in a peripheral region of a display device according to an embodiment of the present invention.

FIG. 8A is an enlarged view showing a part of the substrate peripheral part 305 shown in FIG. 7 is further enlarged and a part of substrate peripheral part 307. FIG. 8B is a top view of FIG. 8A viewed from the top. FIG. 8A is a cross-sectional view cut from line E1 to E2 of FIG. 8B.

As shown in FIGS. 8A and 8B, in a part of the substrate peripheral part 307, a region where the first inorganic insulating layer 231 is exposed includes the concave and convex part 301. The concave and convex part 301 includes, for example, a plurality of bottomed hole 302. A diameter of the bottomed hole 302 is indicated by the diameter D, and the depth of the bottomed hole 302 is indicated by the depth DEP.

The diameter D of the bottomed hole 302 is a diameter of a hole formed in the exposed slope of the first inorganic insulating layer 231. Incidentally, the diameter D of the bottomed hole 302 may not be the diameter of the hole formed in the exposed slope of the first inorganic insulating layer 231. For example, the diameter D of the bottomed hole 302 may be the diameter of a bottom surface of the bottomed hole 302. If the bottomed hole 302 cannot be regarded as a circle, the diameter of the circle whose circumference is the length around the diameter D of the bottomed hole 302 is regarded as the diameter D of the bottomed hole 302. As shown in FIG. 8A, the depth DEP of the bottomed hole 302 is defined as, for example, a length of a vertical line drawn from the exposed slope of the first inorganic insulating layer 231 to a point tangent to a line parallel to the exposed slope of the first inorganic insulating layer 231. In an embodiment of the present invention, the diameter D of the bottomed hole 302 is preferably a value ranging from 0.1 μm to 0.6 μm.

In the FIGS. 8A and 8B, examples are shown in which the shape of the bottomed hole 302 is a circular. The shape of the bottomed hole 302 is not limited to the shape shown in FIGS. 8A and 8B. The shape of the bottomed hole 302 may be an oval or a polygonal shape. In addition, in FIGS. 8A and 8B, the bottomed hole 302 includes a part that does not contact each other and a part in contact with each other, but is not limited to this configuration. Further, the size of the plurality of bottomed hole 302 may be substantially the same and may be different. The plurality of bottomed hole 302 are randomly arranged, but may be arranged in a direction along E1 to E2 and a direction crossing E1 to E2. In a part of region of the concave and convex part 301, the plurality of bottomed hole 302 may be arranged to increase in size from the second inorganic insulating layer 233 side towards the second interlayer insulating layer 209 side. Further, the plurality of bottomed hole 302 may be arranged to decrease in size from the second inorganic insulating layer 233 side towards the second interlayer insulating layer 209 side.

The display device 100 according to an embodiment of the present invention, the organic insulation layer 232 is sealed with the first inorganic insulating layer 231 and the second inorganic insulating layer 233. As a result, in the display device 100 according to an embodiment of the present invention, it is possible to suppress moisture entering from the outside and reaching the light emitting element 240 via the organic insulation layer 232. The second organic insulating layer 236 functions as a mask for etching the first inorganic insulating layer 231 and the second inorganic insulating layer 233. When the second organic insulating layer 236 is etched, a part of slope of the second inorganic insulating layer 233 and a part of slope of the first inorganic insulating layer 231 are exposed and the second inorganic insulating layer 233 and the first inorganic insulating layer 231 arranged in the center of the substrate 101 are not exposed. Furthermore, in the substrate peripheral part 300, a region where the first inorganic insulating layer 231 is exposed includes the concave and convex part 301. Since the concave and convex part 301 reflects the light incident on the display device. The light incident on the display device is diffusely reflected. As a result, the substrate peripheral part 300 appears as a black line. Therefore, in the inspection at the time of manufacturing the display device 100, it is possible to identify the substrate peripheral part 300 with respect to the display region 103. That is, in the manufacturing inspection of the display device 100 according to the embodiment of the present invention, the location of the display device 100 to be sealed can be specified. Therefore, the display device 100 according to an embodiment of the present invention, is a display device capable of detecting a manufacturing defect in which moisture penetrates into the light emitting element at an early stage.

In the example shown in FIG. 4 to 8B, the second organic insulating layer 236 covers the first inorganic insulating layer 231 and the second inorganic insulating layer 233. The second organic insulating layer 236 is retracted by etching, and the first inorganic insulating layer 231 is etched. In display device 100 according to an embodiment of the present disclosure, the second organic insulating layer 236 is retracted by etching, and both the first inorganic insulating layer 231 and the second inorganic insulating layer 233 may be etched. As with the first inorganic insulating layer 231, the second inorganic insulating layer 233 may have the concave and convex part 301.

The display device 100 according to an embodiment of the present invention has a structure described with reference to FIG. 4 to 8B, and moisture entering from the outside in the display device 100 is reduced. In the manufacturing inspection of the display device 100 according to the embodiment of the present invention, the location of the display device 100 to be sealed can be specified. Therefore, the display device 100 according to an embodiment of the present invention, is a display device capable of detecting a manufacturing defect in which moisture penetrates into the light emitting element at an early stage.

[5. Manufacturing Method of Display Device]

Figure 9A:
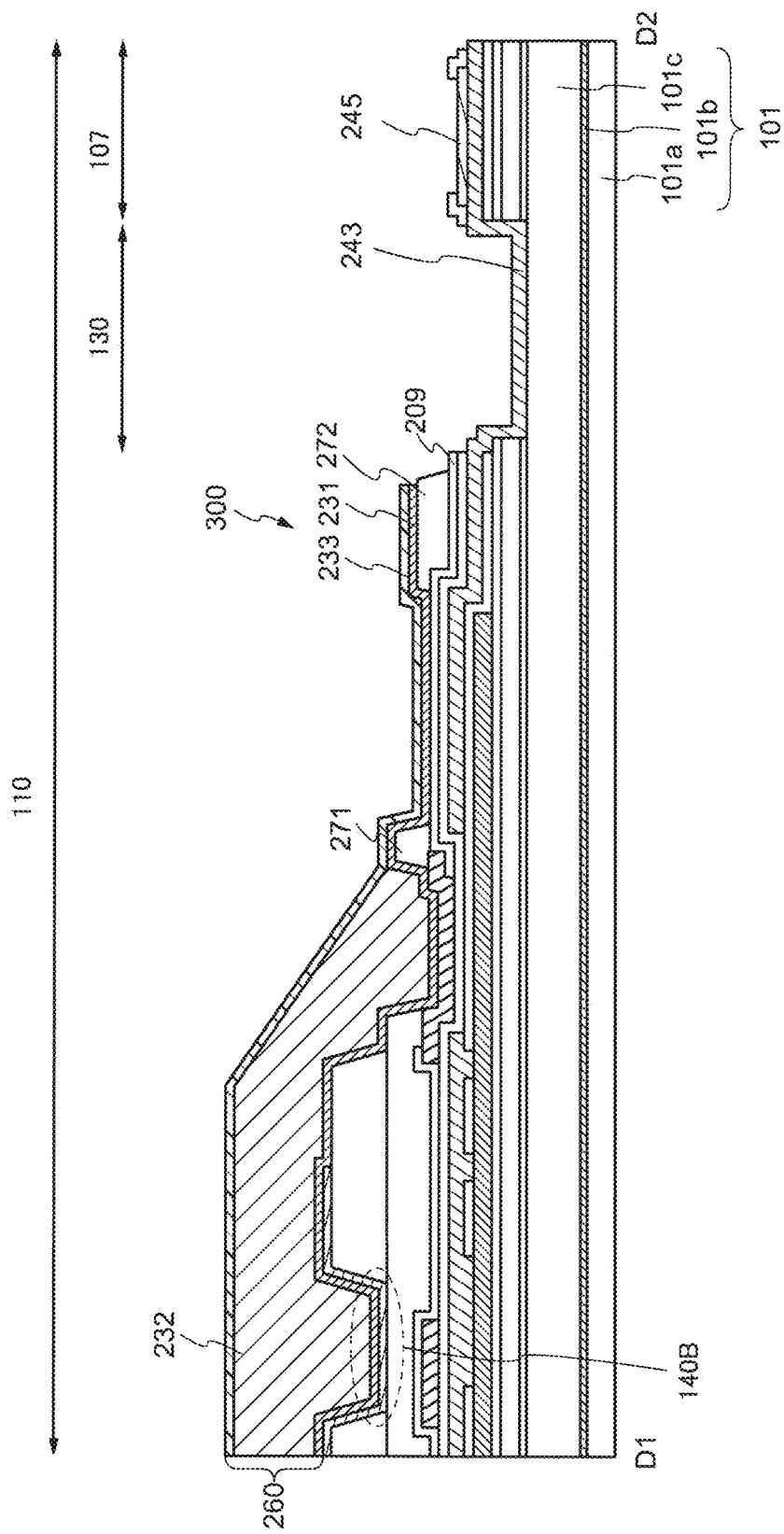
FIG. 9A is a cross-sectional view showing a method for manufacturing a display device according to an embodiment of the present invention.
Figure 9B:
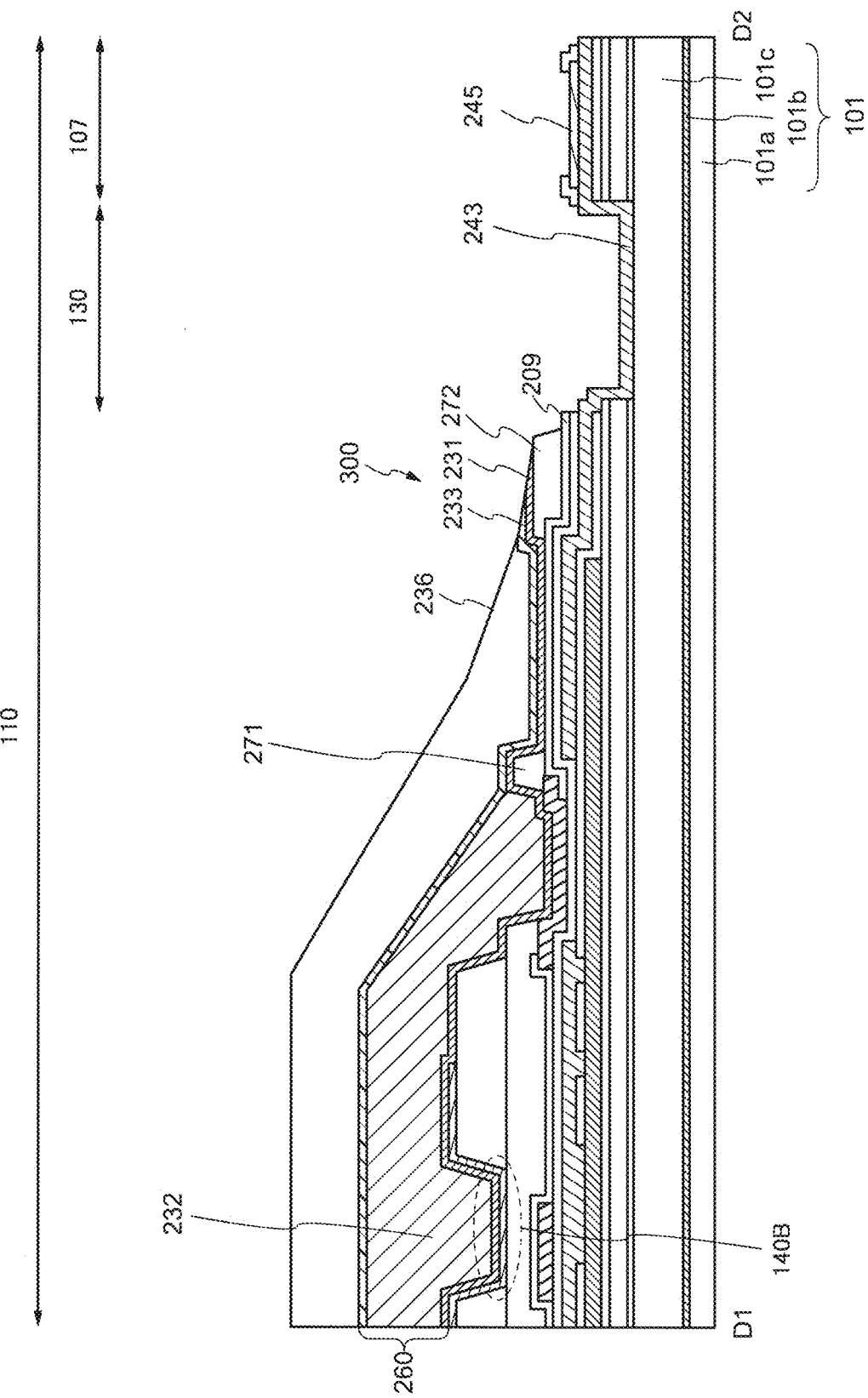
FIG. 9B is a cross-sectional view showing a method for manufacturing a display device according to an embodiment of the present invention.

FIGS. 9A and 9B are a cross-sectional view showing a method for manufacturing the display device 100 according to an embodiment of the present invention. FIGS. 9A and 9B are obtained by cutting the display device 100 shown in FIG. 1 from a line D1 to D2. The manufacturing process is described by exemplifying a cross-sectional view as shown in FIGS. 9A and 9B, similarly to FIG. 6. For example, a manufacturing process of a transistor and a manufacturing process of a light emitting element in a display device, which are known in the art, may be used as a manufacturing method from the substrate 101 to the counter electrode 224. Detailed description of these manufacturing methods is omitted here. Descriptions of the same or similar components as those in FIG. 1 to 8B are omitted in some cases.

As shown in FIG. 9A, the sealing film 260 is formed on the counter electrode 224 of the light emitting element 240. As one of the sealing films 260, the first inorganic insulating layer 231 is formed. Subsequently, as one of the sealing films 260, the organic insulation layer 232 is formed on the first inorganic insulating layer 231. The first inorganic insulating layer 231 can be formed by a sputtering method or a CVD method or the like. Further, the organic insulation layer 232 can be formed by a dip coating method, a spin coating method, a spray coating method, an ink jet method or the like.

Next, as one of the sealing films 260, the second inorganic insulating layer 233 is formed on the organic insulation layer 232. The second inorganic insulating layer 233, similarly to the first inorganic insulating layer 231, can be formed by a sputtering method or a CVD method or the like.

Subsequently, as shown in FIG. 9B, the second organic insulating layer 236 is formed on the second inorganic insulating layer 233. If the thickness of the second organic insulating layer 236 is under 10 μm, it may be impossible to prevent scratches caused by handling in a later process. Further, when the thickness of the second organic insulating layer 236 exceeds, for example, 20 μm, the coating quantity of the resin which is the material for forming the second organic insulating layer 236 increases. As a result, display defects (streak or the like) caused by curing defects may occur. Therefore, the thickness of the second organic insulating layer 236 is preferably more than 10 μm and less than 20 μm.

Although not shown, the first inorganic insulating layer 231 and the second inorganic insulating layer 233 are etched using the second organic insulating layer 236 as masks. In an embodiment of the present invention, the first inorganic insulating layer 231 and the second inorganic insulating layer 233 are formed by dry etching. For example, the first inorganic insulating layer 231 and the second inorganic insulating layer 233 are dry etched using a fluorine-based gas and an oxygen gas ($O_2$ gas). By using the fluorine-based gas and the oxygen gas ($O_2$ gas), the second inorganic insulating layer 233 can have a slope and the concave and convex part 301 as shown in FIGS. 5 and 6.

Further, for example, by changing the gas flow rate ratio between the fluorine-based gas and the oxygen gas ($O_2$ gas), the angle α of slope of the first inorganic insulating layer 231, the width W of the first inorganic insulating layer 231, the diameter D of the bottomed hole 302, the depth DEP of the bottomed hole 302, and the like can be changed. That is, by changing the gas flow rate ratio between the fluorine-based gas and the oxygen gas ($O_2$ gas), the structure of the concave and convex part 301 can be changed. Specifically, the diameter D of the bottomed hole 302 can be larger and the depth DEP of the bottomed hole 302 can be deeper by decreasing the flow rate ratio of the oxygen gas ($O_2$ gas) to the fluorine-based gas. That is, the surfaces of the first inorganic insulating layer 231 can become rough.

For example, when the ion species components in the first inorganic insulating layer 231 before and after dry etching are measured by an ion chromatography method, the proportion of the fluorine ions in the first inorganic insulating layer 231 after dry etching is more than twice the proportion of the fluorine ions in the first inorganic insulating layer 231 before dry etching. At this time, area of the first inorganic insulating layer 231 is 210 $\mu m^2$.

When the ion species components in the first inorganic insulating layer 231 before and after dry etching are measured by, for example, time-of-flight secondary ion mass spectrometry (TOF-SIMS), the ratio of the fluorine ions in the first inorganic insulating layer 231 after dry etching is more than 100 times the ratio of the fluorine ions in the first inorganic insulating layer 231 before dry etching. At this time, area of the first inorganic insulating layer 231 is 500 $\mu m^2$.

When the surface of the second inorganic insulating layer 233 becomes rough, since the difference in irregularities of the concave and convex part 301 becomes clearer, and the light incident on the display device is easily diffused reflection. As a result, the black lines of the substrate peripheral part 300 becomes clearer. Therefore, in the manufacturing inspection of the display device 100 according to the embodiment of the present invention, the location of the display device 100 to be sealed can be specified. Therefore, the display device 100 according to an embodiment of the present invention, is a display device capable of detecting a manufacturing defect in which moisture penetrates into the light emitting element at an early stage.

The second organic insulating layer 236 retracts by etching, so the first inorganic insulating layer 231 and the second inorganic insulating layer 233 are etched to form a slope in the second organic insulating layer 236, the second inorganic insulating layer 233, and the first inorganic insulating layer 231. The second organic insulating layer 236 retracts by etching to expose a part of a slope of the second inorganic insulating layer 233 and a part of a slope of the first inorganic insulating layer 231 to the second inorganic insulating layer 233 and the first inorganic insulating layer 231 arranged in the center of the substrate 101. The second inorganic insulating layer 233 and the first inorganic insulating layer 231 arranged in the center of the substrate 101 are covered with the second organic insulating layer 236. Therefore, the concave and convex part 301 as shown in the substrate peripheral part 300 is not formed in the second inorganic insulating layer 233 and the first inorganic insulating layer 231 arranged in the center of the substrate 101. Therefore, in the display device 100 according to an embodiment of the present invention, the roughness of the surface of the first inorganic insulating layer 231 in the central part of the substrate 101 (the central part of the display region 103) is different from the roughness of the surface of the first inorganic insulating layer 231 in the substrate peripheral part 300 of the peripheral region 110 arranged continuously to the display region 103. As a result, a diffused reflection of the central part of the substrate 103 is different form a diffused reflection of the substrate peripheral part 300. The configuration of the first inorganic insulating layer 231 according to an embodiment of the present invention is able to change the color of the central part of the display region 103 and the substrate peripheral part 300.

The first inorganic insulating layer 231 and the second inorganic insulating layer 233 are etched using the second organic insulating layer 236 as a mask. Thereby, the first inorganic insulating layer 231 and the second inorganic insulating layer 233 are removed in the peripheral region 110 of the substrate 101, and the terminal 107 is exposed in the peripheral region 110.

Finally, by attaching the polarization plate 102 on the second organic insulating layer 236, the display device 100 according to the embodiment of the present invention can be manufactured.

Second Embodiment

Referring to FIG. 10 to 13, another exemplary configuration of the display device 100 according to an embodiment of the present invention will be described. In an embodiment of the present invention, a display device 100A is described in which a touch sensor 120 is arranged on the sealing film 260. Description of the same or similar components as those in FIG. 1 to 9B are omitted in some cases.

Figure 10:
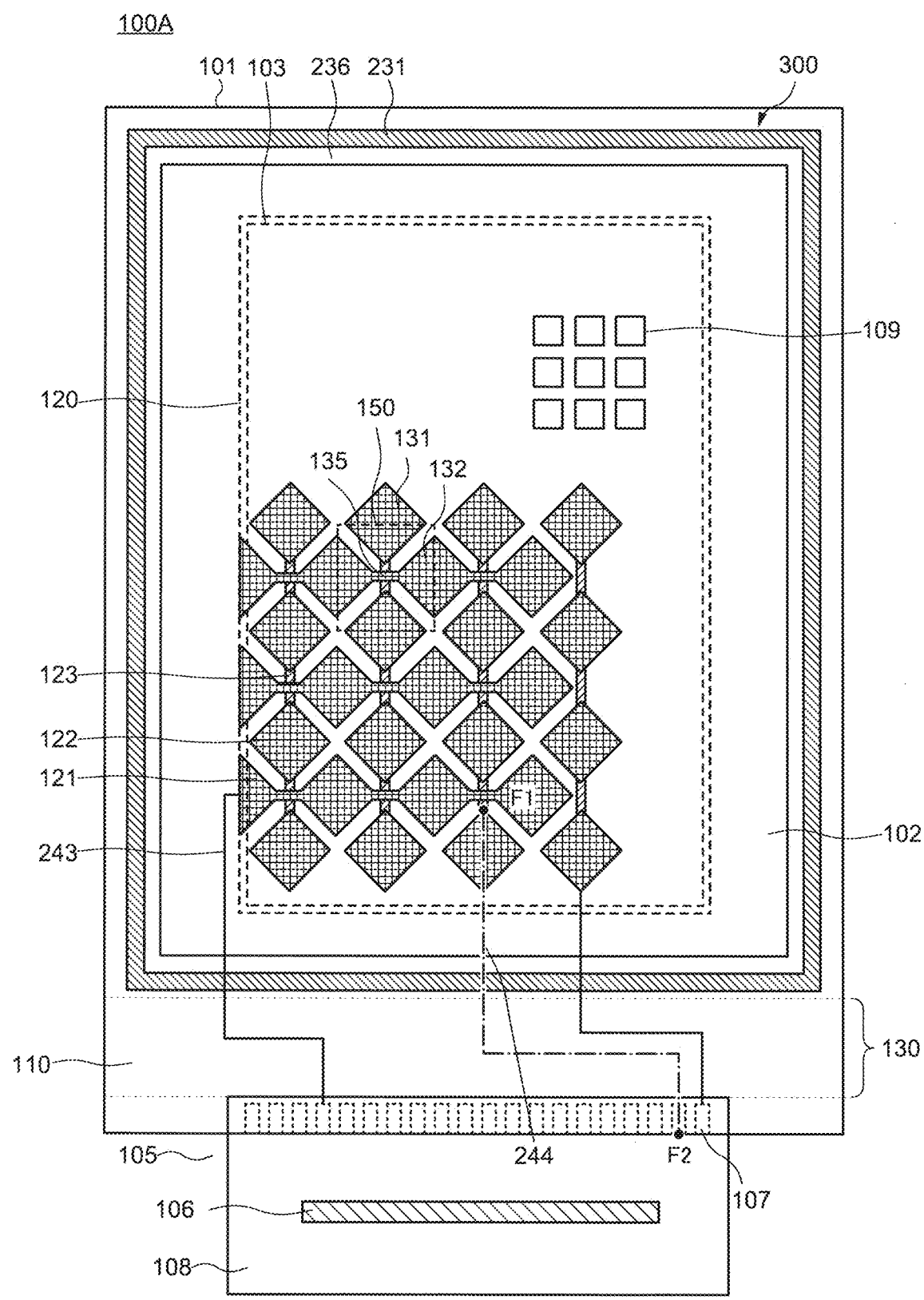
FIG. 10 is a schematic view showing a configuration of a display device according to an embodiment of the present invention.

FIG. 10 is a plan view of the display device 100A according to an embodiment of the present invention. The display device 100A shown in FIG. 10 is the same as the display device 100 shown in FIG. 1 except that the touch sensor 120 is arranged to overlap with the display region 103 arranged on the substrate 101, and the scanning line drive circuit part 104 and the polarization plate 102 are not shown.

The touch sensor 120 has a plurality of sensor electrode 121 arranged in stripes in the row direction and a plurality of sensor electrode 122 arranged in stripes in the column direction. One of the sensor electrode 121 and the sensor electrode 122 is called a transmitting electrode (Tx), the other is called a receiving electrode (Rx). Each sensor electrode 121 and each sensor electrode 122 are separated from each other, and a capacitance is formed therebetween. For example, touching the display region 103 via the sensor electrode 121 and the sensor electrode 122 by a finger or the like (hereinafter touching), the capacitance between the sensor electrode 121 and the sensor electrode 122 changes. The location of the touching is determined by reading this change. Thus, the sensor electrode 121 and the sensor electrode 122 form a so-called projection-type capacitive touch sensor 120.

The sensor electrode 122 is electrically connected to a wiring layer 243 which is located in the peripheral region 110. The terminal 107 is connected to the flexible printed circuit substrate 108 and a signal for the touch sensor is provided from the driver IC 106 to the sensor electrode 122 via the terminal 107. Incidentally, the wiring layer 243 may be arranged on a region overlapping the scanning line drive circuit part 104.

The sensor electrode 121 is electrically connected to the wiring layer 244 which is located in the peripheral region 110. The terminal 107 is connected to the flexible printed circuit substrate 108 and a signal for the touch sensor is provided from the driver IC 106 to the sensor electrode 122 via the terminal 107.

In the touch sensor 120, the sensor electrode 121 has a connection electrode 123 and a conductive layer 131 including a plurality of opening 134 having a substantially square shape, sensor electrode 122 includes a plurality of opening 132 having a substantially square shape, a conductive layer 133, and a connection region 135. Also, the sensor electrode 121 and the sensor electrode 122 are spaced apart from each other and electrically independent.

Figure 11:
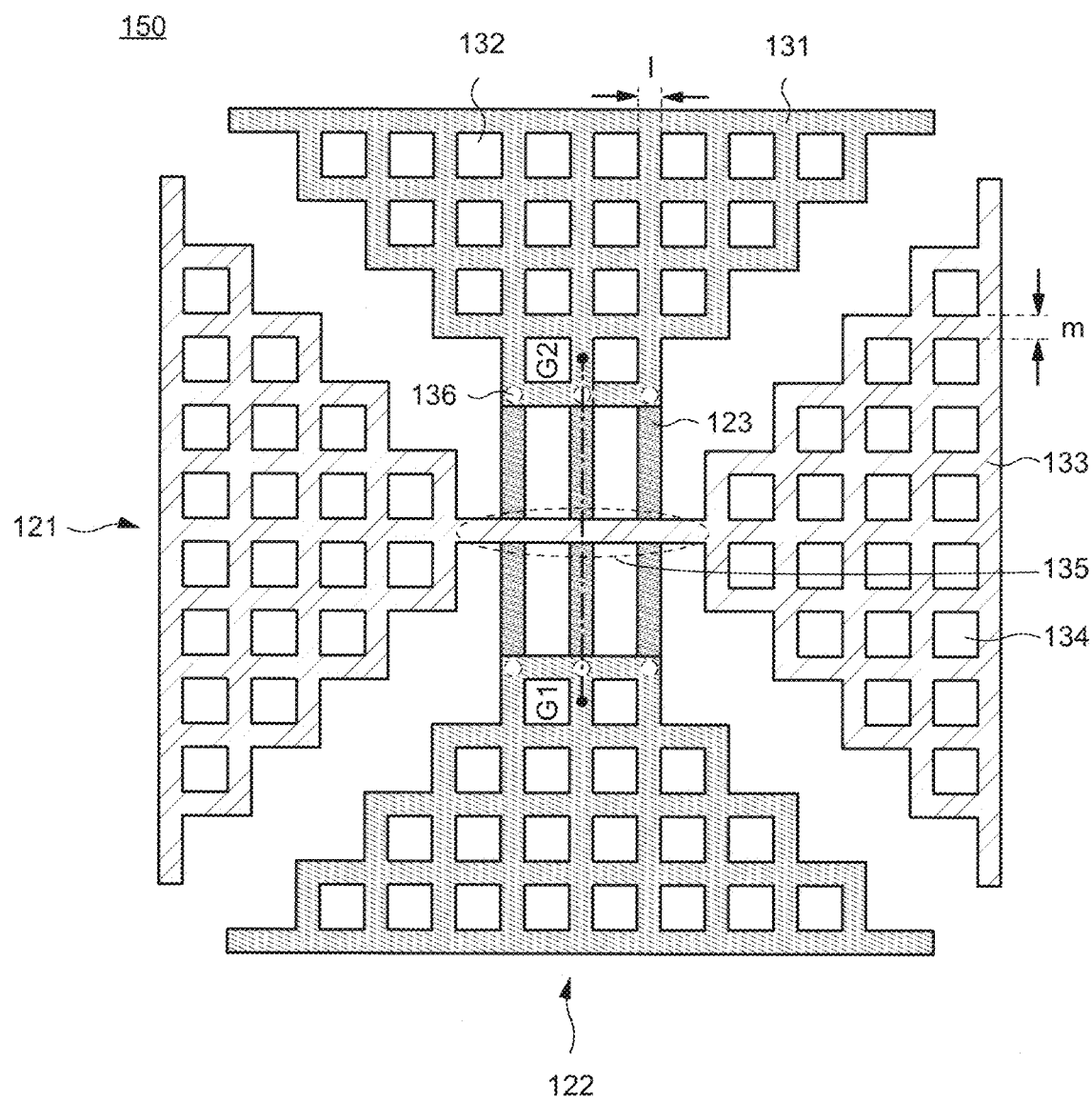
FIG. 11 is an enlarged view showing a part of a display device shown in FIG. 10.

FIG. 11 is an enlarged view of a region 150 in the display device 100A shown in FIG. 10. In FIG. 11, the sensor electrode 121 and the sensor electrode 122 are shown with different hatching to distinguish the sensor electrode 121 and the sensor electrode 122, but the sensor electrode 121 and the sensor electrode 122 are provided in the same conductive layer. In the sensor electrode 121, the conductive layer 133 adjacent to the left and right are connected via the connection region 135. In the sensor electrode 122, the upper and lower adjacent the conductive layer 131 are connected via the connection electrode 123. In each of the conductive layer 131 and the conductive layer 133, a plurality of opening 132 and a plurality of opening 134 are arranged in a matrix. Thus, the conductive layer 131 and the conductive layer 133 have a mesh shape. Here, the width of wiring constituting the conductive layer 131 is more than 1 µm and less than 10 µm or more than 2 µm and less than 8 µm, typically 5 µm. Similarly, the width of wiring constituting the conductive layer 133 is more than 1 µm and less than 10 µm or more than 2 µm and less than 8 µm, typically 5 µm.

As shown in FIG. 11, the connection region 135 for connecting the conductive layer 133 adjacent to the left and right is arranged along a first direction, and the connection electrode 123 for connecting the conductive layer 131 adjacent to the upper and lower are arranged along a second direction intersecting the first direction. In other words, the connection electrode 123 has a region that intersects a part of the sensor electrode 121. In FIG. 11, the width of the connection electrode 123 is the same as the width of the conductive layer 131, but the width of connection electrode 123 may be larger than the width of the conductive layer 131. Preferably, the connection electrode 123 does not overlap the light emitting region of the light emitting element 240 of the pixel 109.

Figure 12:
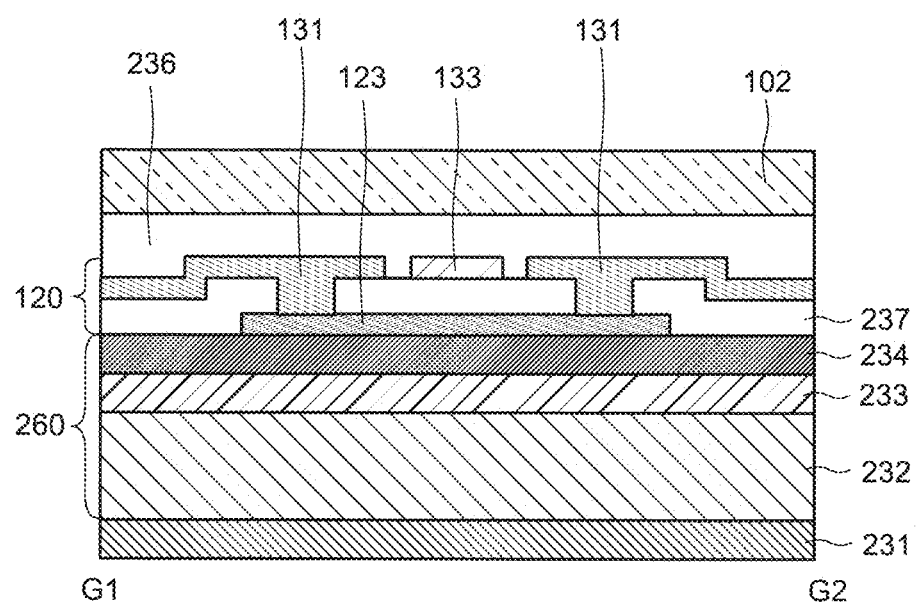
FIG. 12 is a cross-sectional view of a line from G1 to G2 of a display device shown in FIG. 11

FIG. 12 is a cross-sectional view obtained by cutting the touch sensor 120 shown in FIG. 11 of a line G1 to G2. In FIG. 12, the structure below the first inorganic insulating layer 231 is omitted. As shown in FIG. 12, in order to prevent the sensor electrode 121 and the sensor electrode 122 from contacting, a third inorganic insulating layer 237 is arranged in the lower layer of the conductive layer 131 of the sensor electrode 121 and the conductive layer 131 of the electrode 122. Then, through the third inorganic insulating layer 237, the connection electrode 123 is arranged for connecting the conductive layer 131 adjacent to the upper and lower of the sensor electrode 122. Thus, in a region where the sensor electrode 121 and the sensor electrode 122 intersect, it is possible to prevent the sensor electrode 121 and the sensor electrode 122 from contacting.

The third inorganic insulating layer 237 is in contact with the second organic insulating layer 236. By using the same material in the first inorganic insulating layer 231 or the second inorganic insulating layer 233 as the material of the third inorganic insulating layer 237, the adhesion of the third inorganic insulating layer 237 to the second organic insulating layer 236 can be improved. The third inorganic insulating layer 237 can be made of, for example, a silicon nitride, a silicon nitride oxide, an aluminum nitride, or a silicon nitride oxide.

Figure 13:
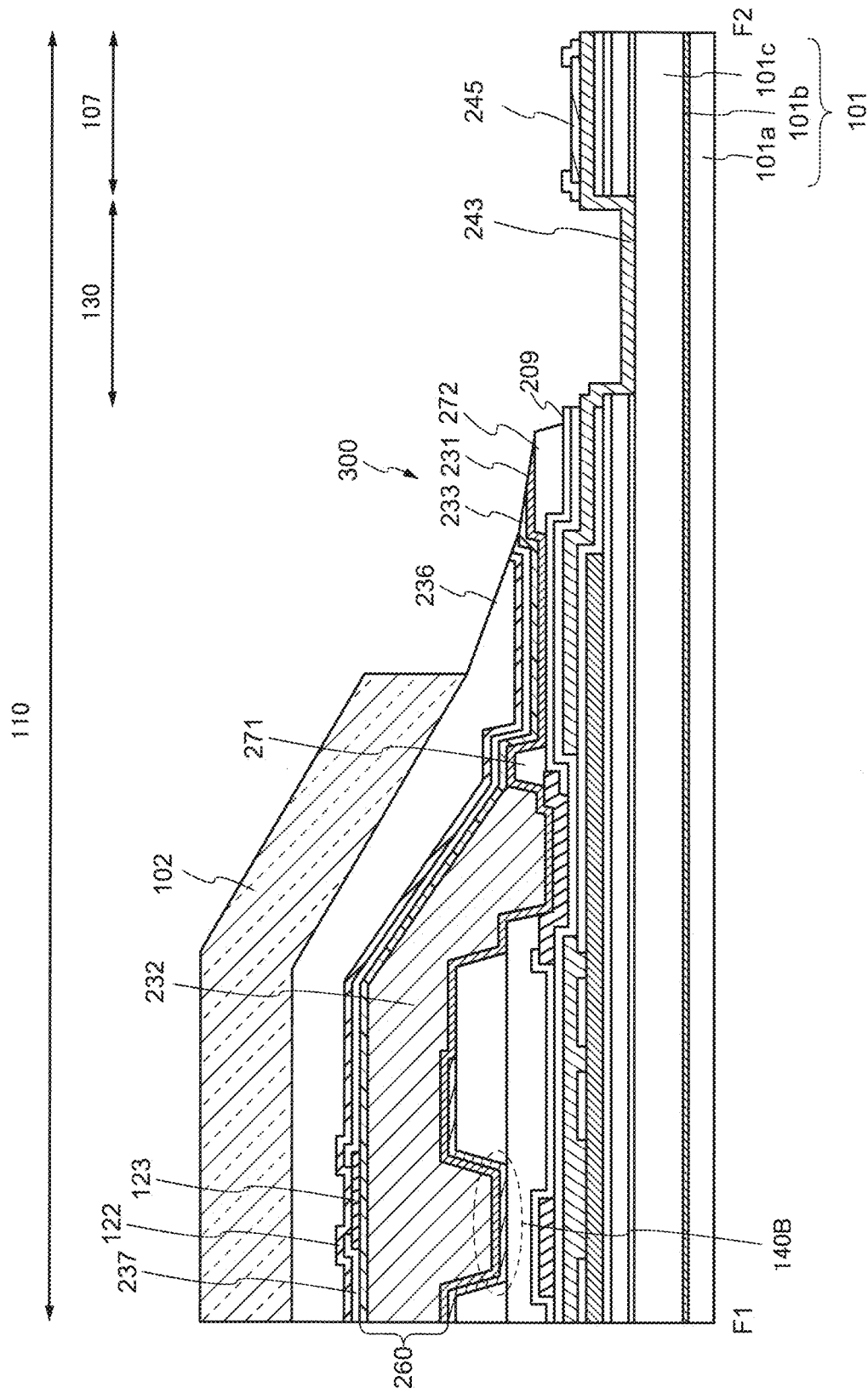
FIG. 13 is a cross-sectional view of a line from F1 to F2 of a display region shown in FIG. 10.

FIG. 13 is a cross-sectional view in which the display device 100A shown in FIG. 10 is cut from a line F1 to F2. Specifically, FIG. 13 shows a connection region between the sensor electrode 122 and the connection electrode 123. The configuration from the substrate 101 to the sealing film 260 is the same as that of FIG. 1. In an embodiment of the present invention, the touch sensor 120 is arranged on the second inorganic insulating layer 233 of the sealing film 260. The connection electrode 123 is arranged on the second inorganic insulating layer 233, the second organic insulating layer 236 is arranged on the connection electrode 123, and the sensor electrode 122 is arranged on the second organic insulating layer 236. A wiring layer 244A extends in the peripheral region 110 and is exposed near end part of the peripheral region 110. The region in contact with the wiring layer 244A and the transparent conductive film 245 becomes the terminal 107.

The configuration of the substrate peripheral part 300 of the display device 100A is the same as that of the display device 100. Therefore, in the display device 100A in which the touch sensor 120 is arranged on the sealing film 260, as similar to the display device 100, the location to be sealed can be specified during the inspection at the time of manufacturing.

All display device that can be suitably modified and implemented by a person skilled in the art based on the display device 100 and 100A described above as an embodiment of the present invention are also within the scope of the present invention as long as they encompass the gist of the present invention.

In an embodiment of the present invention, and organic EL display device is exemplified as a disclosed example, but the present invention can be applied to any flat-panel type display device such as another self light emitting type display device. It is needless to say that the present invention can be applied from small to large type without any particular limitation.

In the scope of the present invention, a person skilled in the art can correspond to various modifications and corrections, and it is understood that these modifications and corrections also belong to the scope of the present invention. For example, as long as the gist of the present invention is provided, a person skilled in the art who adds, deletes, or changes the design of components or adds, omits, or changes the conditions of processes to each of the above-described embodiments is included in the scope of the present invention.

Even if it is other working effects which differ from the working effect brought about by the mode of each above-mentioned embodiment, what is clear from the description in this specification, or can be easily predicted by the person skilled in the art is naturally understood to be brought about by the present invention.

What is claimed is:
1. A display device comprising:
a display region; and
a peripheral region arranged outside of the display region, the peripheral region comprising:
an interlayer insulating layer;
a first inorganic insulating layer arranged on the interlayer insulating layer;
a first organic insulating layer arranged on the first inorganic insulating layer;
a second inorganic insulating layer arranged on the first organic insulating layer; and
a second organic insulating layer arranged on the second inorganic insulating layer;
wherein a sloped part of the first inorganic insulating layer is exposed at an end part of the periphery region, and includes a bottomed hole with a concave and convex part,
a part of the first inorganic insulating layer which is over the display region is in contact with the second inorganic insulating layer, and
a density of fluorine ions in the concave and convex part is more than 100 times greater than the density of the fluorine ions in the first inorganic insulating layer arranged in the display region.

2. The display device according to claim 1, wherein the first inorganic insulating layer in the display region does not include the concave and convex part.

3. The display device according to claim 1, wherein an angle formed between the sloped part of the first inorganic insulating layer and a surface of the interlayer insulating film which is in contact with the first inorganic insulating layer is more than 20 degrees and less than 26 degrees.

4. The display device according to claim 1, wherein a size of the bottomed hole is more than 0.1 µm and less than 0.6 µm.

5. The display device according to claim 1, wherein a cross section view, a width W where the first inorganic insulating layer is exposed is more than 3.7 µm and less than 5.6 µm.

6. The display device according to claim 1, wherein at least one of the first inorganic insulating layer or the second insulating layer includes a nitride.

7. The display device according to claim 6, wherein the nitride is a silicon nitride.

* * * * *